United States Patent
Minemura

(10) Patent No.: US 9,397,043 B1
(45) Date of Patent: Jul. 19, 2016

(54) SEMICONDUCTOR MEMORY DEVICE

(71) Applicant: KABUSHIKI KAISHA TOSHIBA, Minato-ku (JP)

(72) Inventor: Yoichi Minemura, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/850,444

(22) Filed: Sep. 10, 2015

Related U.S. Application Data

(60) Provisional application No. 62/139,241, filed on Mar. 27, 2015.

(51) Int. Cl.
 *H01L 29/792* (2006.01)
 *H01L 23/528* (2006.01)
 *H01L 27/115* (2006.01)

(52) U.S. Cl.
 CPC .......... *H01L 23/528* (2013.01); *H01L 27/1157* (2013.01); *H01L 27/11582* (2013.01)

(58) Field of Classification Search
 CPC ...................................... H01L 33/06
 See application file for complete search history.

(56) References Cited

U.S. PATENT DOCUMENTS

| | | | | |
|---|---|---|---|---|
| 4,998,147 A * | 3/1991 | Beckwith | .......... | H01L 29/42316 257/270 |
| 9,064,864 B1 * | 6/2015 | Stessin | .................... | H01L 23/50 |
| 9,070,445 B2 | 6/2015 | Yasuda et al. | | |
| 2008/0173932 A1 * | 7/2008 | Kidoh | ............... | H01L 27/11568 257/324 |
| 2009/0212350 A1 | 8/2009 | Kidoh et al. | | |
| 2011/0033995 A1 | 2/2011 | Katsumata et al. | | |
| 2011/0063916 A1 * | 3/2011 | Maeda | .................... | G11C 16/04 365/185.17 |
| 2011/0199825 A1 * | 8/2011 | Han | ........................ | G11C 16/10 365/185.11 |
| 2013/0007353 A1 * | 1/2013 | Shim | ..................... | G11C 16/10 711/103 |
| 2015/0102399 A1 | 4/2015 | Sakuma et al. | | |

FOREIGN PATENT DOCUMENTS

| | | |
|---|---|---|
| JP | 2009-200443 | 9/2009 |
| JP | 2009-224465 | 10/2009 |
| JP | 2014-241180 | 12/2014 |
| JP | 2015-079802 | 4/2015 |

* cited by examiner

*Primary Examiner* — Victor A Mandala
(74) *Attorney, Agent, or Firm* — Oblon, McClelland, Maier & Neustadt, L.L.P.

(57) ABSTRACT

A semiconductor memory device according to an embodiment comprises a stacked body, the stacked body including a plurality of conductive layers disposed on a semiconductor substrate and an inter-layer insulating film disposed between the plurality of conductive layers. A columnar semiconductor layer is surrounded as a stacking direction of the stacked body. An isolation film extends from an outer surface of the stacked body to a bottom of the stacked body and has a longitudinal direction in a second direction. At least some of the isolation films include a base portion extending in the second direction and a terminal portion positioned at an end of the base portion, and a width of the end in a third direction intersecting the second direction is larger than a width of the base portion.

13 Claims, 16 Drawing Sheets

SEMICONDUCTOR MEMORY DEVICE

CROSS REFERENCE TO RELATED APPLICATIONS

This application is based on and claims the benefit of priority from prior U.S. Provisional Patent Application No. 62/139,241, filed on Mar. 27, 2015, the entire contents of which are incorporated herein by reference.

BACKGROUND

1. Field

Embodiments described herein relate to a semiconductor memory device.

2. Description of the Related Art

Flash memory is an example of semiconductor memory devices. Particularly, a NAND type flash memory is generally and widely used since it is available at low cost and has a large capacity. Moreover, up to now, many technologies for further increasing the capacity of this NAND type flash memory have been proposed. One of such technologies include a structure in which memory cells are disposed three-dimensionally. In such a three-dimensional type semiconductor memory device, the memory cells are disposed in a stacking direction and a conductive layer extends from each of those memory cells disposed in the stacking direction.

DETAILED DESCRIPTION

A semiconductor memory device according to an embodiment comprises: a semiconductor substrate; and a stacked body, the stacked body including a plurality of conductive layers disposed on the semiconductor substrate and an interlayer insulating film disposed between the plurality of conductive layers. A columnar semiconductor layer is surrounded by the stacked body and extends in a first direction as a stacking direction of the stacked body.

A memory gate insulating film is disposed between the columnar semiconductor layer and the stacked body and includes a charge accumulation film. An isolation film extends from an outer surface of the stacked body to a bottom of the stacked body and has a longitudinal direction in a second direction. At least some of the isolation films include a base portion extending in the second direction and a terminal portion positioned at an end of that base portion, and a width of the end in a third direction intersecting the second direction is larger than a width of the base portion.

Semiconductor memory devices according to embodiments will be described below with reference to the drawings. Note that these embodiments are merely examples. For example, nonvolatile semiconductor memory devices described below have a structure in which a memory string extends linearly in a perpendicular direction to a substrate, but a similar structure may be applied also to a U-shaped structure in which the memory string is doubled back on an opposite side midway. In addition, each of the drawings of the nonvolatile semiconductor memory devices employed in the embodiments below is schematic, and thicknesses, widths, ratios, and so on, of layers are not necessarily identical to those of the actual nonvolatile semiconductor memory devices.

Moreover, the embodiments below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor film acting as a channel provided in a column shape perpendicularly to a substrate; and a gate electrode film provided on a side surface of the semiconductor film via a charge accumulation layer. However, a similar structure may be applied also to a memory cell of another form, for example, a SONOS (Semiconductor-Oxide-Nitride-Oxide-Semiconductor) type memory cell or a MANOS (Metal-Aluminum Oxide-Nitride-Oxide-Semiconductor) type memory cell, one employing hafnium oxide ($HfO_x$) or tantalum oxide ($TaO_x$) as an insulating layer, or a floating gate type memory cell.

First Embodiment

First, an overall configuration of a semiconductor memory device according to a first embodiment will be described.

Figure 1:
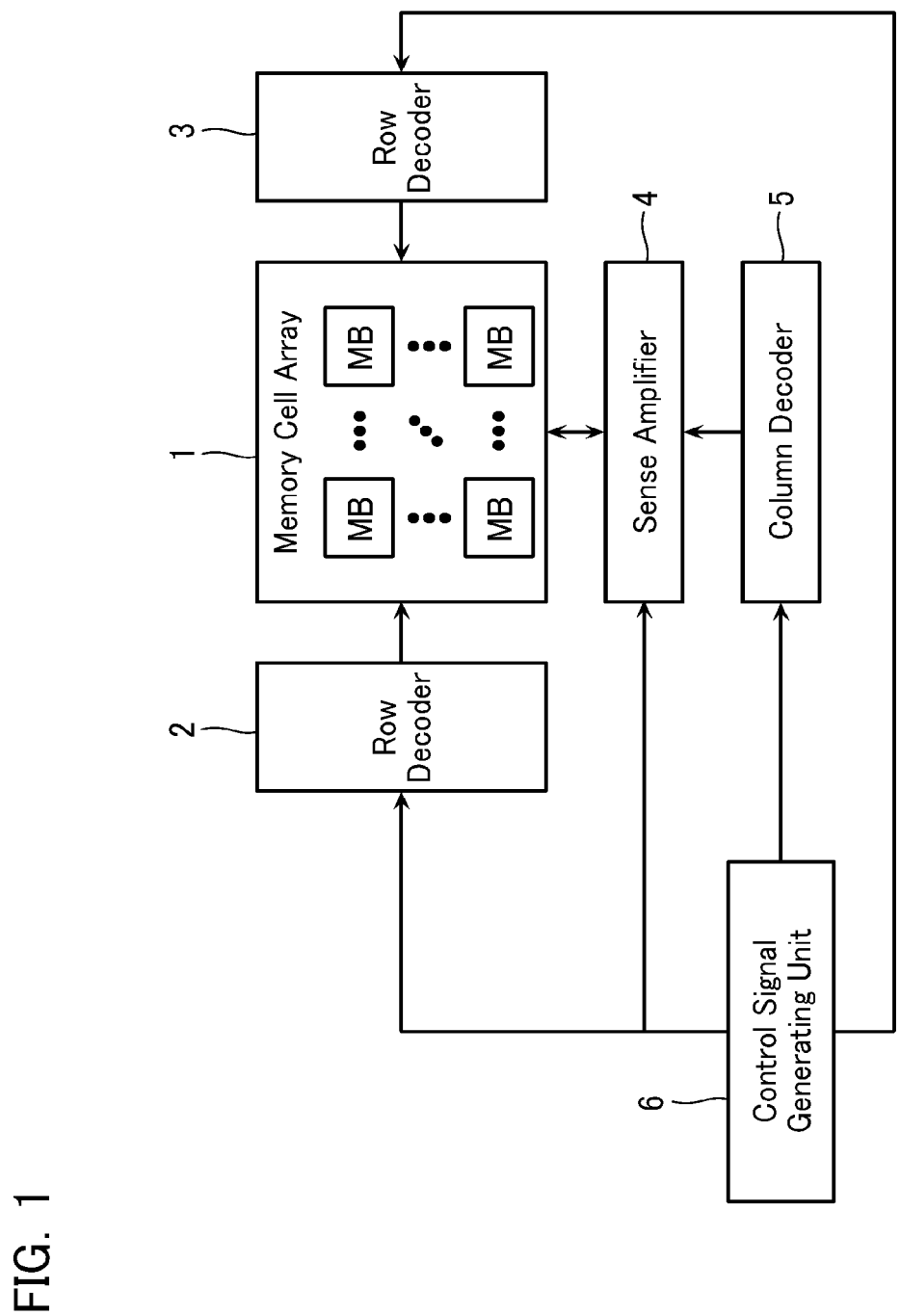
FIG. 1 is a view showing functional blocks of a semiconductor memory device according to a first embodiment.

FIG. 1 is a view showing functional blocks of the semiconductor memory device according to the first embodiment. This semiconductor memory device comprises: a memory cell array 1; row decoders 2 and 3; a sense amplifier 4; a column decoder 5; and a control signal generating unit 6.

The memory cell array 1 includes a plurality of memory blocks MB. Each of the memory blocks MB includes a plurality of memory transistors, that is, a plurality of memory cells MC arranged three-dimensionally therein. The memory block MB is a minimum unit of an erase operation of data.

The row decoders 2 and 3 decode a downloaded block address signal, and so on, and control a write operation and a read operation of data of the memory cell array 1. The sense amplifier 4 detects and amplifies an electrical signal flowing in a bit line during the read operation. The column decoder 5 decodes a column address signal and controls the sense amplifier 4. The control signal generating unit 6, in addition to boosting a reference voltage and generating a high voltage employed during the write operation or the erase operation, generates a control signal and controls the row decoders 2 and 3, the sense amplifier 4, and the column decoder 5.

Figure 2:
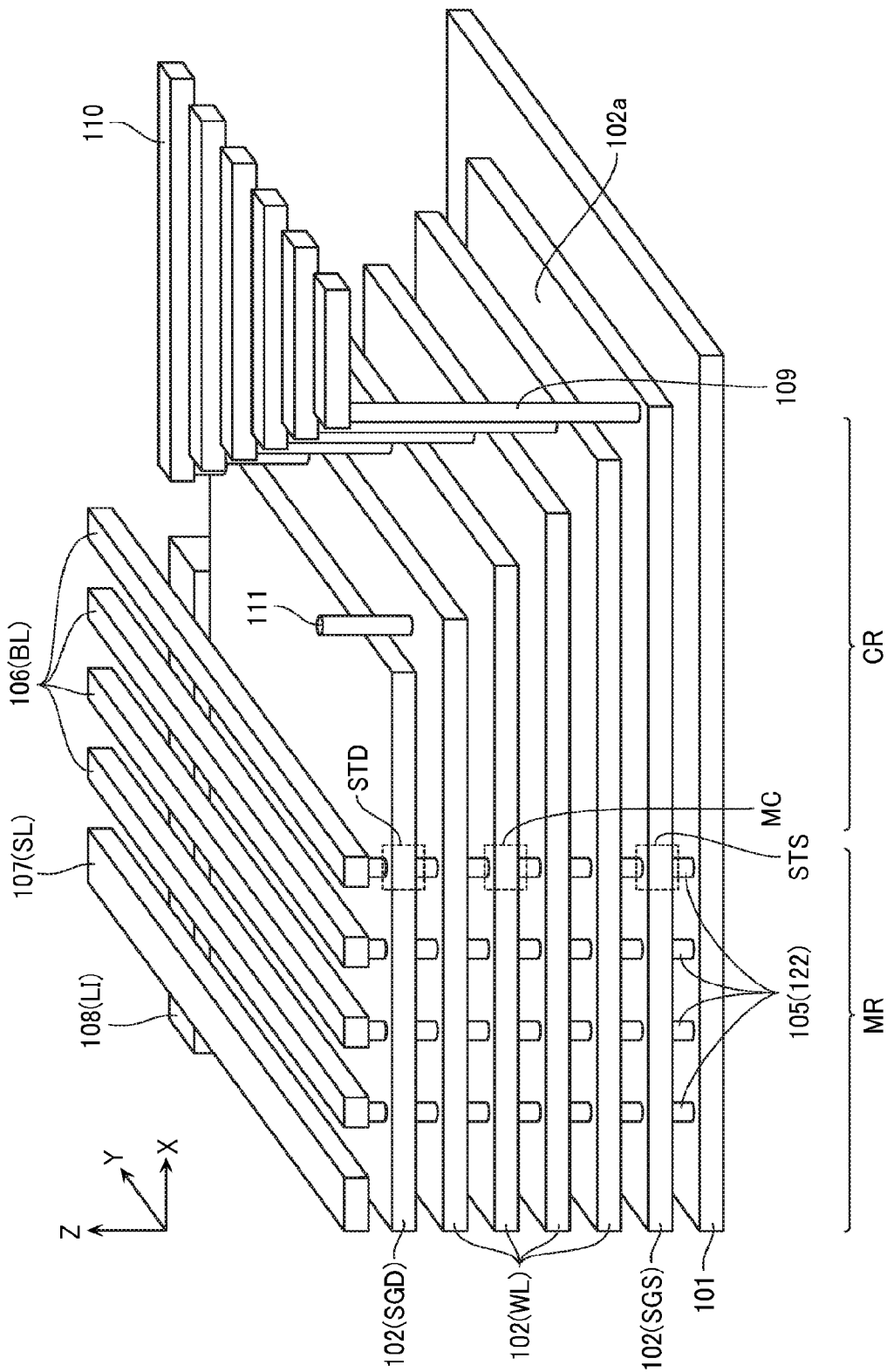
FIG. 2 is a schematic perspective view showing a configuration of part of a memory cell array of the semiconductor memory device according to the first embodiment.

Next, a schematic configuration of the memory cell array 1 according to the present embodiment will be described with reference to FIG. 2. FIG. 2 is a schematic perspective view showing a configuration of part of the memory cell array. Note that in FIG. 2, to simplify description, illustration of part of the configuration is omitted. Moreover, to simplify illustration, the numbers of each of wiring lines are also made different to those in the other drawings.

As shown in FIG. 2, the memory cell array 1 according to the first embodiment comprises: a substrate 101; and a plurality of conductive layers 102 stacked in a Z direction on the substrate 101. In addition, the memory cell array 1 includes a plurality of memory columnar bodies 105 extending in the Z direction. As shown in FIG. 2, an intersection of the conductive layer 102 and the memory columnar body 105 functions as a source side select gate transistor STS, the memory cell MC, or a drain side select gate transistor STD. The conductive layer 102 is configured from a conductive layer of the likes of tungsten (W) or polysilicon, for example, and functions as a word line WL, a source side select gate line SGS, and a drain side select gate line SGD.

As shown in FIG. 2, the plurality of conductive layers 102 comprise a wiring line portion formed in steps, at an end in an X direction. Hereafter, a region where the memory cells MC, and so on, are disposed will be referred to as a memory region MR, and a portion having the conductive layers 102 drawn out from this memory region MR to form the conductive layers 102 in steps will be referred to as a stepped wiring line region CR.

The conductive layer 102 in the stepped wiring line region CR comprises a contact portion 102a that does not face a lower surface of the conductive layer 102 positioned in a layer above it. Moreover, the conductive layer 102 is connected to a contact plug 109 at this contact portion 102a. Moreover, a wiring line 110 is provided at an upper end of the contact plug 109. Note that the contact plug 109 and the wiring line 110 are configured from a conductive layer of the likes of tungsten.

In addition, as shown in FIG. 2, the memory cell array 1 according to the first embodiment comprises a support 111. The support 111 is provided so as to have its longitudinal direction with respect to a stacking direction of a stacked body of the plurality of conductive layers 102 and an inter-layer insulating film between the plurality of conductive layers 102. This support 111 is formed to support a posture of this stacked body in manufacturing steps of the stacked body. As will be mentioned later, the conductive layer 102 may be formed by a step in which an inter-layer insulating film and a sacrifice film are stacked, after which the sacrifice film is removed by wet etching, and so on, and a cavity portion where the sacrifice film has been removed is implanted with a conductive film. In the case that such a step is executed, the previously mentioned support 111 is provided to prevent the inter-layer insulating film from collapsing. In FIG. 2, only one support 111 is representatively illustrated, but in the actual device, a greater number of supports 111 may be provided.

In addition, as shown in FIG. 2, the memory cell array 1 according to the first embodiment comprises a conductive layer 108 that faces side surfaces in a Y direction of the plurality of conductive layers 102 and extends in the X direction. A lower surface of the conductive layer 108 contacts the substrate 101. The conductive layer 108 is configured from a conductive layer of the likes of tungsten (W), for example, and functions as a source contact LI.

Note that a material of the conductive layer 102 is conceivably configured from a conductive layer of the likes of WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$, for example, besides the above-described tungsten (W).

Moreover, as shown in FIG. 2, the memory cell array 1 according to the first embodiment comprises a plurality of conductive layers 106 and a conductive layer 107 that are positioned above the plurality of conductive layers 102 and the memory columnar body 105, are arranged in plurality in the X direction, and extend in the Y direction. The memory columnar bodies 105 are respectively electrically connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as a source line SL.

Figure 3:
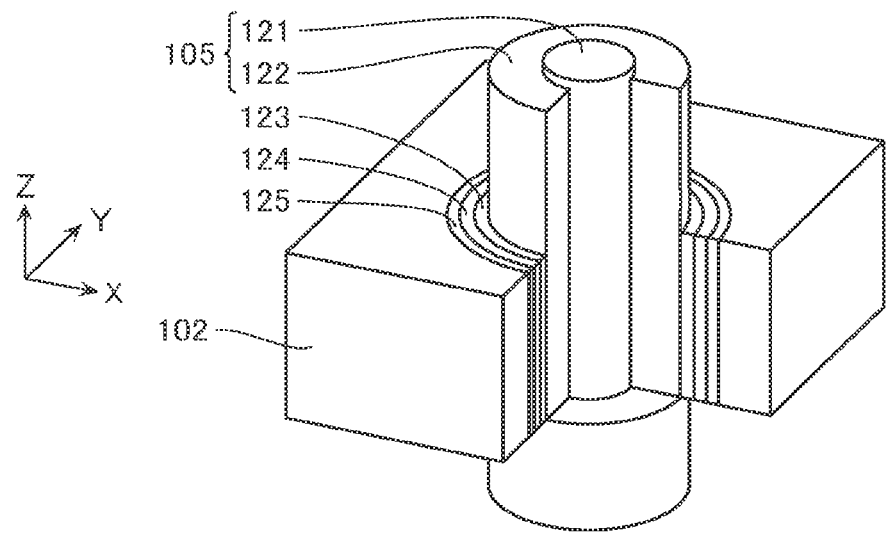
FIG. 3 is a schematic view showing a schematic configuration of a memory cell MC of the semiconductor memory device according to the first embodiment.

Next, a schematic configuration of the memory cell MC according to the first embodiment will be described with reference to FIG. 3. FIG. 3 is a schematic perspective view showing the configuration of the memory cell MC. Note that FIG. 3 shows the configuration of the memory cell MC, but the source side select transistor STS and the drain side select transistor STD may also be configured similarly to the memory cell MC. Moreover, in FIG. 3, part of the configuration is omitted.

As shown in FIG. 3, the memory cell MC is provided at an intersection of the conductive layer 102 and the memory columnar body 105. The memory columnar body 105 comprises: a core insulating layer 121; and a column-shaped semiconductor layer 122 that covers a sidewall of the core insulating layer 121. Furthermore, provided between the semiconductor layer 122 and the conductive layer 102 is a gate insulating film that includes a tunnel insulating layer 123, a charge accumulation layer 124, and a block insulating layer 125. The core insulating layer 121 is configured from an insulating layer of the likes of silicon oxide ($SiO_2$), for example. The semiconductor layer 122 is configured from a semiconductor layer of the likes of polysilicon, for example, and functions as a channel of the memory cell MC, the source side select transistor STS, and the drain side select gate transistor STD. The tunnel insulating layer 123 is configured from an insulating layer of the likes of silicon oxide ($SiO_2$), for example. The charge accumulation layer 124 is configured from an insulating layer capable of charge accumulation, such as silicon nitride (SiN), for example. The block insulating layer 125 is configured from an insulating layer of the likes of silicon oxide ($SiO_2$), for example.

A material of the semiconductor layer 122 is conceivably configured from a semiconductor of the likes of SiGe, SiC, Ge, and C, for example, besides the above-described polysilicon. Moreover, a silicide may be formed at a contact surface of the semiconductor layer 122 with the substrate 101 or the conductive layer 106. Conceivably used in such a silicide are, for example, Sc, Ti, VCr, Mn, Fe, Co, Ni, Cu, Zn, Rh, Pd, Ag, Cd, In, Sn, La, Hf, Ta, W, Re, Os, Ir, Pt, Au, and so on. Furthermore, the following may be added to the silicide formed in this way, namely, Sc, Ti, VCr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, Au, and so on.

The tunnel insulating layer 123 or the block insulating layer 125 are conceivably configured from a material of, for example, an oxide or an oxynitride, besides the above-described silicon oxide ($SiO_2$). Conceivable as the oxide configuring the tunnel insulating layer 123 and the block insulating layer 125 are, for example, SiO2, $Al_2O_3$, $Y_2O_3$, $La_2O_3$ $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and so on. Moreover, the oxide configuring the tunnel insulating layer 123 and the block insulating layer 125 may be $AB_2O_4$. However, A and B referred to here are the same or different elements, and are one of Al, Sc, Ti, V, Cr, Mn, Fe, Co, Ni, Cu, Zn, Ga, and Ge. For example, $AB_2O_4$ is $Fe_3O_4$, $FeAl_2O_4$, $Mn_{1+x}Al_{2-x}O_{4+y}$, $CO_{1+x}Al_{2-x}O_{4+y}$, $MnO_x$, and so on.

Moreover, the oxide configuring the tunnel insulating layer 123 and the block insulating layer 125 may be $ABO_3$. However, A and B referred to here are the same or different elements, and are one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $ABO_3$ is $LaAlO_3$, $SrHfO_3$, $SrZrO_3$, $SrTiO_3$, and so on.

Conceivable as the oxynitride configuring the tunnel insulating layer 123 and the block insulating layer 125 are, for example, SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, and so on.

Moreover, the oxide configuring the tunnel insulating layer 123 and the block insulating layer 125 may be a material in which some of the oxygen elements of each of the materials mentioned above as the oxide configuring the tunnel insulating layer 123 and the block insulating layer 125 are substituted by a nitrogen element.

Note that the following are preferable as the material of the tunnel insulating layer 123 and the block insulating layer 125, namely, $SiO_2$, SiN, $Si_3N_4$, $Al_2O_3$, SiON, $HfO_2$, HfSiON, $Ta_2O_5$, $TiO_2$, or $SrTiO_3$.

Specifically, Si system insulating films of the likes of $SiO_2$, SiN, and SiON include ones in which concentrations of oxygen elements and nitrogen elements are each $1 \times 10^{18}$ atoms/$cm^3$ or more. However, barrier heights of multiple insulating layers differ from each other.

Moreover, the tunnel insulating layer 123 and the block insulating layer 125 may include an impurity atom forming a defect level or a semiconductor/metal dot (quantum dot).

Figure 4:
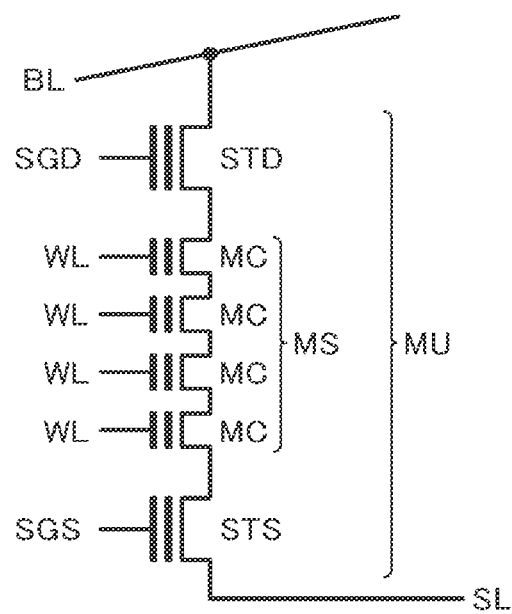
FIG. 4 is an equivalent circuit diagram of a memory unit MU of the semiconductor memory device according to the first embodiment.

The memory cell MC and the select transistors STD and STS having the above-described structure are connected in series to configure a memory unit MU of the kind shown in FIG. 4. That is, the memory unit MU includes: a memory string MS configured from a plurality of the memory cells MC connected in series; and the source side select transistor STS and the drain side select transistor STD connected to both ends of the memory string MS. Note that it is also possible for some of the plurality of the memory cells MC in the memory string MS to be configured as dummy cells not employed in data storage. The number of dummy cells may be set to any number.

Figure 5:
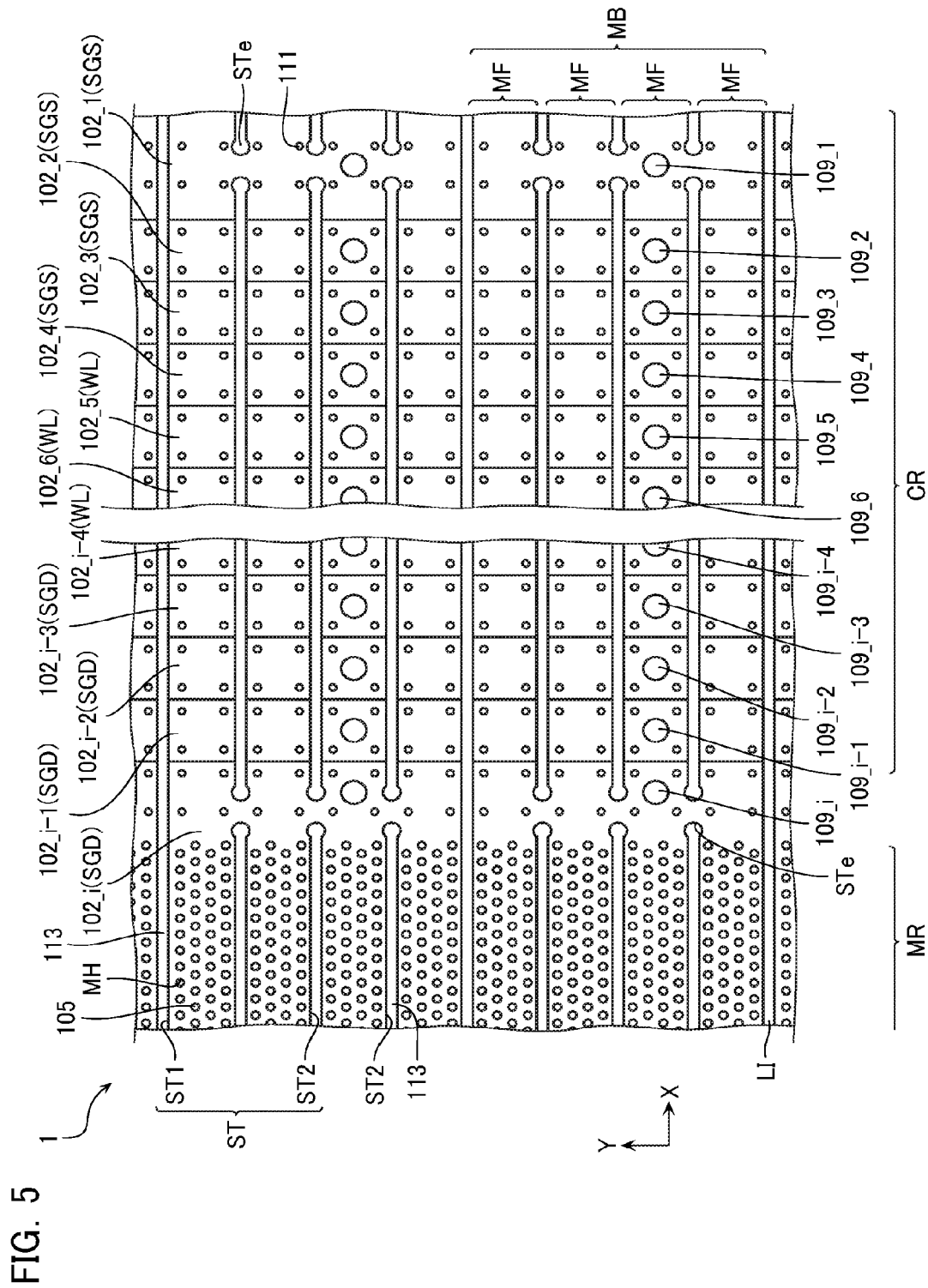
FIG. 5 is a plan view explaining details of configurations of a memory region MR and a stepped wiring line region CR of the semiconductor memory device according to the first embodiment.
Figure 6:
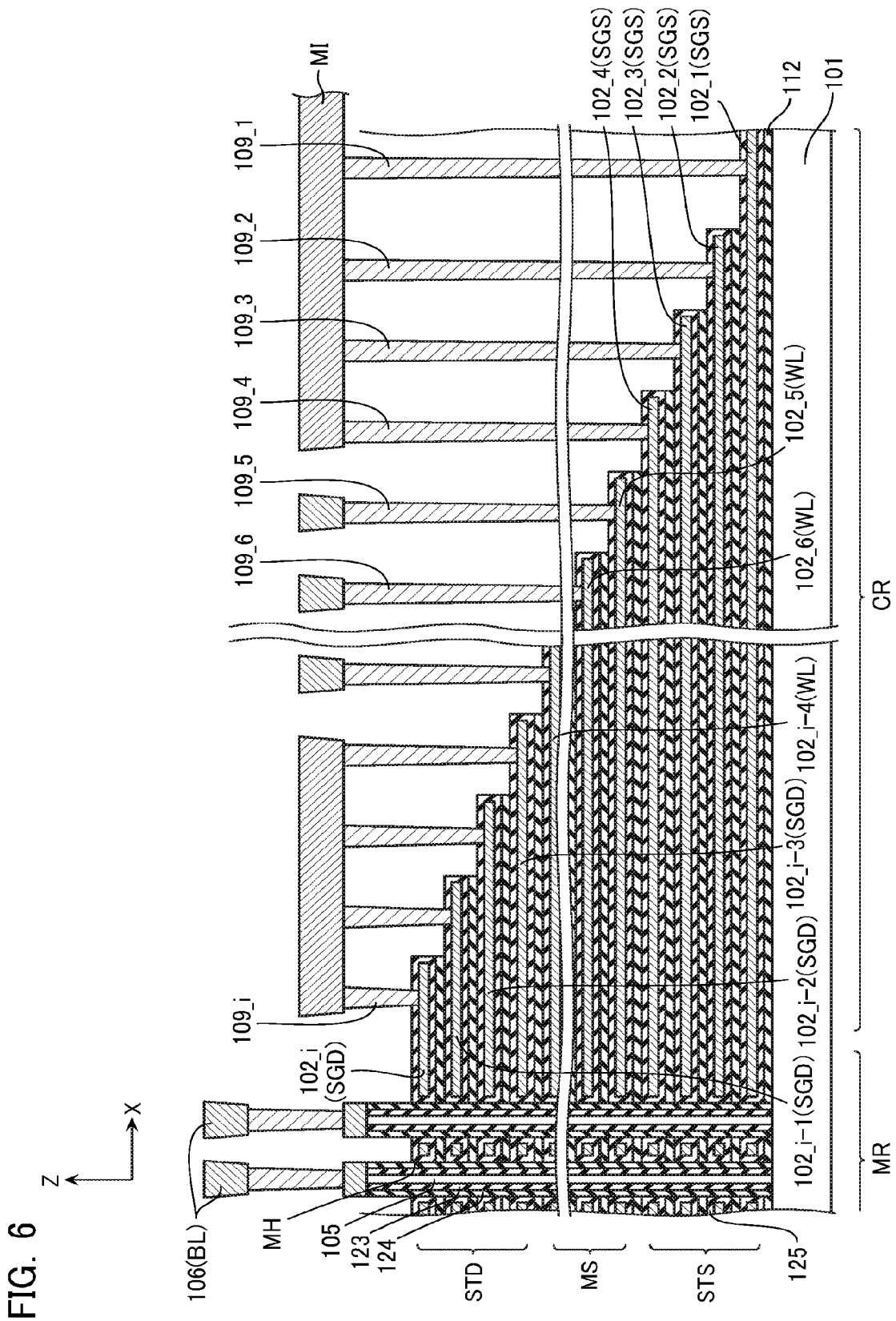
FIG. 6 is a cross-sectional view explaining details of the configurations of the memory region MR and the stepped wiring line region CR of the semiconductor memory device according to the first embodiment.

Next, details of configurations of the memory region MR and the stepped wiring line region CR of the semiconductor memory device according to the first embodiment will be described with reference to FIGS. 5 and 6. FIG. 5 is a plan view showing the configurations of the memory region MR and the stepped wiring line region CR. Moreover, FIG. 6 is a cross-sectional view of the memory region MR and the stepped wiring line region CR taken along the XZ plane of FIG. 5. The numbers of word lines WL and select gate lines SGD and SGS are different to those of the schematic view of FIG. 2.

As shown in FIG. 5, the memory cell array 1 according to the first embodiment comprises: the memory region MR where the memory unit MU is formed; and the stepped wiring line region CR extending from the memory region MR.

As shown in FIG. 6, in the memory region MR, a plurality (i) of the conductive layers 102 (102_1 to 102_i) are stacked on the substrate 101 sandwiching inter-layer insulating films 112 and 113.

In addition, a large number of memory holes MH are formed in the memory region MR so as to penetrate this stacked body of the conductive layers 102 and inter-layer insulating films 112 and 113. The previously mentioned memory columnar body 105 is formed inside this memory hole MH via the tunnel insulating layer 123 and the charge accumulation layer 124 (refer to FIG. 6). That is, the memory columnar body 105 is formed such that its periphery is surrounded by the stacked body of the conductive layers 102 and inter-layer insulating films 112 and 113.

Note that as shown in FIG. 6, the block insulating layer 125 is formed not inside the memory hole MH, but so as to cover a periphery of the conductive layers 102_1 to 102_i. An upper end of the memory columnar body 105 is connected to the previously mentioned conductive layer 106 (bit line BL) via a contact wiring line, and so on.

Note that in the example illustrated in FIG. 5, the memory holes MH are provided in a staggered lattice shape in the XY plane. Note that an arrangement in the XY plane of the memory holes MH may be appropriately adjusted to a triangular arrangement or a square arrangement, and so on.

Moreover, as shown in FIGS. 5 and 6, the stepped wiring line region CR has a large number of the previously mentioned supports 111 formed therein. In addition, connected to an exposed portion of each of the conductive layers 102 configuring the stepped wiring line region CR are the contact plugs 109 (109_1 to 109_i). The contact plug 109 is connected at its upper end to an upper layer wiring line M1, and is connected, via such an upper layer wiring line M1 or an unillustrated wiring line layer, to an external circuit. This upper layer wiring line M1 functions as the wiring line 110 of FIG. 2.

As shown in FIG. 6, in the first embodiment, the conductive layers 102_1 to 102_4 function as the source side select gate line SGS and as a control gate electrode of the source side select gate transistor STS. That is, in this structure illustrated in FIG. 6, four source side select gate lines SGS are connected to one source side select transistor STS.

In addition, the conductive layers 102_5 to 102_i-4 function as the word line WL and as a control gate of the memory cell MC. That is, in this structure illustrated in FIG. 6, (i-8) memory cells MC are included in one memory string MS, and (i-8) word lines WL are connected to one memory string MS.

Moreover, the conductive layers 102_i-3 to 102_i function as the drain side select gate line SGD and as a control gate electrode of the drain side select gate transistor STD. That is, in this structure illustrated in FIG. 6, four drain side select gate lines SGD are connected to one drain side select transistor STD.

In addition, the stepped wiring line region CR has a structure in which the above-mentioned conductive layer 102 and inter-layer insulating film 113 are formed in steps. As a result of being formed in steps, each of the conductive layers 102 has an exposed portion not covered by the conductive layer in the layer above it, and is configured to be connectable to the contact plug 109 at this exposed portion. The contact plug 109 is connected at its upper end to the upper layer wiring line M1.

Moreover, formed in the memory region MR and the stepped wiring line region CR are a large number of slits ST (ST1 and ST2) that are formed having the X direction as their longitudinal direction. The slit ST is implanted with an insulating isolation film 113 or is implanted, via an insulating isolation film, with the previously mentioned source contact LI. That is, the insulating film 113, by being implanted in the slit ST, plays a role of electrically insulating and isolating the conductive layers 102 positioned on both sides of the insulating film 113. This slit ST is formed in order to remove a later-to-be-described sacrifice film by etching, when forming the conductive layer 102.

As shown in FIG. 5, the slit ST extends having the X direction as its longitudinal direction, and is formed so as to divide the stacked body of the conductive layers 102 and inter-layer insulating films from an outer surface to a bottom of the stacked body. As a result, the slit ST divides the conductive layers 102_2 to 102_i of the memory region MR and the stacked wiring line region CR in the Y direction. There are two kinds of slits ST, namely the slits ST1 and ST2. Each of the slits ST1 and ST2 is formed so as to extend from the outer surface of the conductive layer 102_i to the substrate 101. As a result of this slit ST1, the memory region MR and the stepped wiring line region CR are divided into a plurality of the memory blocks MB. Furthermore, one memory block MB is divided into a plurality of memory fingers MF by the slit ST2.

The slit ST1 is a slit formed between two memory blocks MB, and the slit ST2 is a slit formed between two memory fingers MF in one memory block MB. The slit ST1 divides two memory blocks MB to the lowermost layer conductive layer 102_1. On the other hand, the slit ST2 includes a terminal portion STe at any position of the stepped wiring line region CR. In this example illustrated in FIG. 5, the terminal portion STe is formed in the uppermost layer conductive layer 102_i and the lowermost layer conductive layer 102_1. The slits ST2 are formed continuously in the X direction in a form where they face each other with their terminal portions therebetween. Therefore, the slit ST2 does not electrically divide the conductive layers 102 of adjacent memory fingers MF, and the adjacent memory fingers MF are electrically connected to each other at a portion of the terminal portion STe (more specifically, the conductive layer 102 positioned on a first side in the Y direction as viewed from the slit ST2 and the conductive layer 102 positioned on a second side in the Y direction as viewed from the slit ST2 are electrically connected at a position between two of the terminal portions STe disposed aligned in the X direction). The reason that the slit ST2 includes the terminal portion STe in this way is to suppress the required number of contact plugs while leaving the plurality of memory fingers MF included in one memory block MB connected without being electrically divided. Note that a position where the terminal portion STe is formed is of course not limited to that of the illustrated example. For example, as shown in FIG. 5, it is possible for the terminal portions STe to be formed both in the uppermost layer conductive layer 102_i and the lowermost layer conductive layer 102_1. It is also possible for the terminal portion STe to be formed only in the lowermost layer conductive layer 102_1.

Figure 7:
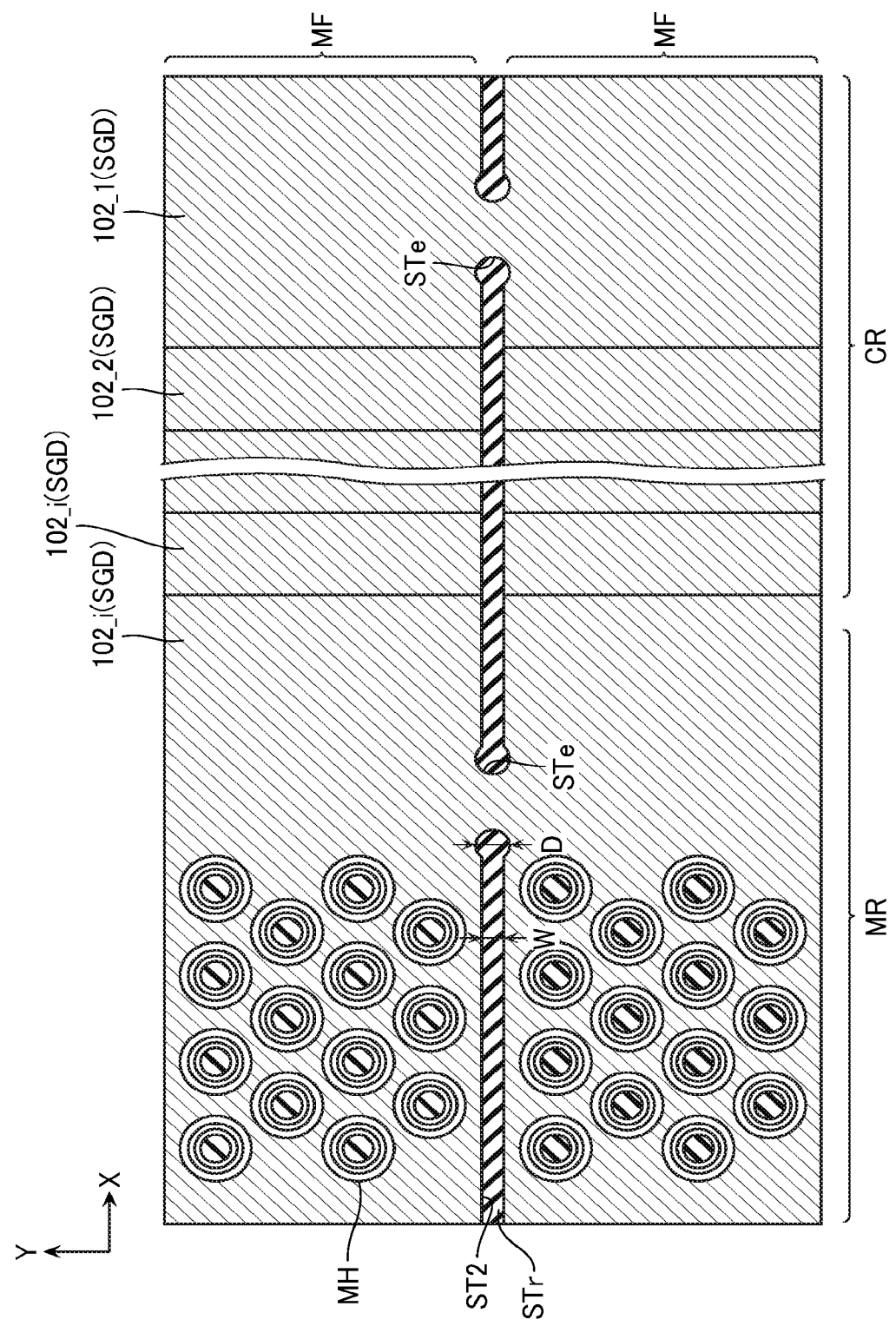
FIG. 7 is an enlarged view showing details of a shape of a slit ST2 of the semiconductor memory device according to the first embodiment.

FIG. 7 shows an enlarged view of the slit ST2 (note that in FIG. 7, illustration of the contact plug 109 and the support 111 is omitted). The slit ST2 dividing the memory fingers MF includes the terminal portion STe that terminates in any of the conductive layers 102, and a width D (maximum width) in the Y direction of that terminal portion STe is set larger compared to a width W of another portion (base portion STr). The insulating isolation film 113 implanted in this slit ST2 also has a shape conforming to an inner wall of this slit ST2. The shape of the terminal portion STe is not actually a circular shape or an elliptical (oblong) shape, but has a shape which may be approximated to a circle or ellipse (oblong). As an example, the width D of the terminal portion STe is 1.2 or more times W. In the first embodiment, the reason that the shape of the terminal portion STe is set in this way is because, as will be described next, it is effective when employing sacrifice layers to form the stacked body of the conductive layers 102 and inter-layer insulating films. Note that the "terminal portion STe" in this embodiment is assumed to refer to a portion between a start point and an end point along the X direction, the start point being a point where its width in the Y direction begins to get larger than the width W of the base portion STr the end point being a point as a tip portion in the X direction.

Manufacturing steps of the stacked body of the conductive layers 102 and inter-layer insulating films in this first embodiment will be described with reference to FIGS. 8A to 8G. As will be described later, the stacked body of the conductive layers 102 and inter-layer insulating films is formed by first alternately stacking inter-layer insulating films and sacrifice films, and after removing the sacrifice film, implanting the conductive layer 102 in a gap where that sacrifice film was removed. In the stacked body of the conductive layers 102 and the inter-layer insulating films 103, the conductive layer 102 is preferably configured by a metal film of the likes of tungsten, for example, from the viewpoint of lowering of resistivity of the conductive layer 102. However, it is not easy for the memory holes MH penetrating the tungsten and silicon oxide films to be formed with high density. Therefore, as will be described next, the stacked body of the conductive layers 102 configured from the metal film and the inter-layer insulating films 103 is formed by alternately stacking inter-layer insulating films and sacrifice films, and after removing the sacrifice film, implanting the conductive layer 102 in a gap where that sacrifice film was removed. This will be described in detail below with reference to FIGS. 8A to 8G.

Figure 8A:
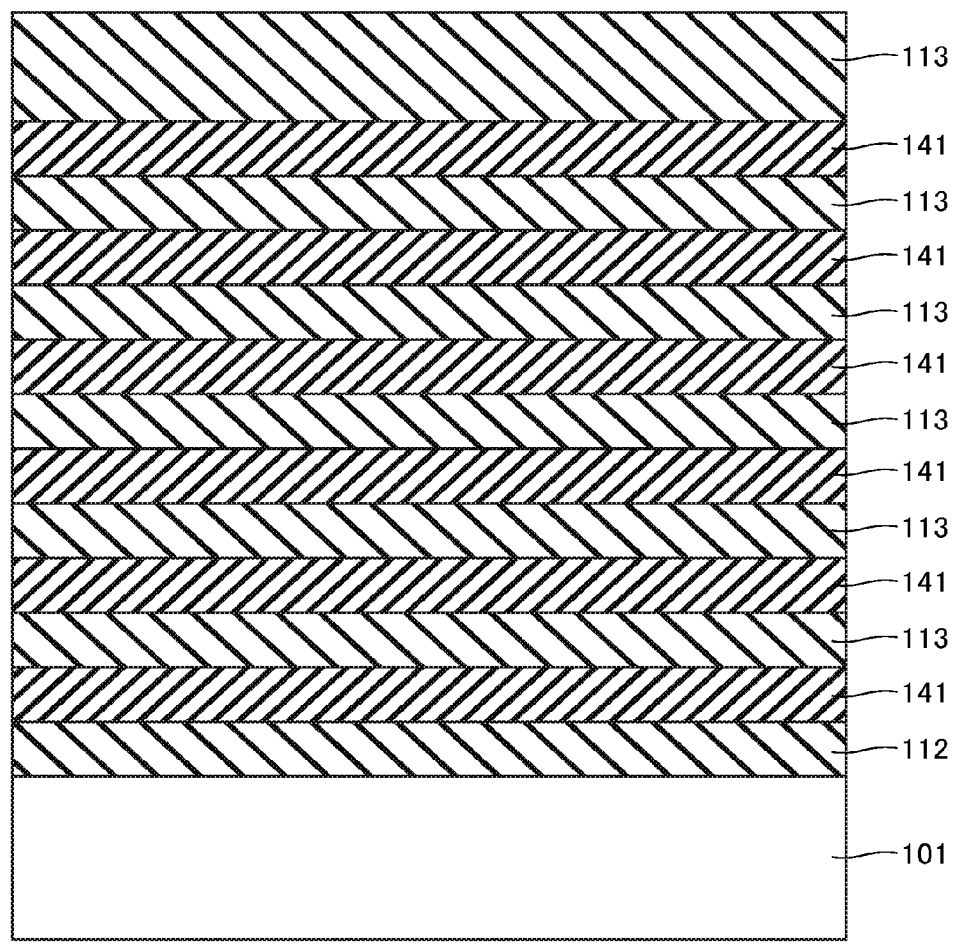
FIGS. 8A to 8G are process drawings showing manufacturing steps of the semiconductor memory device according to the first embodiment.

First, as shown in FIG. 8A, inter-layer insulating films 112 and 113 are stacked on the semiconductor substrate 101, sandwiching between them a sacrifice layer 141. In the case that the inter-layer insulating films 112 and 113 are silicon oxide films, the sacrifice layer 141 may be formed from a silicon nitride film (SiN).

Figure 8B:
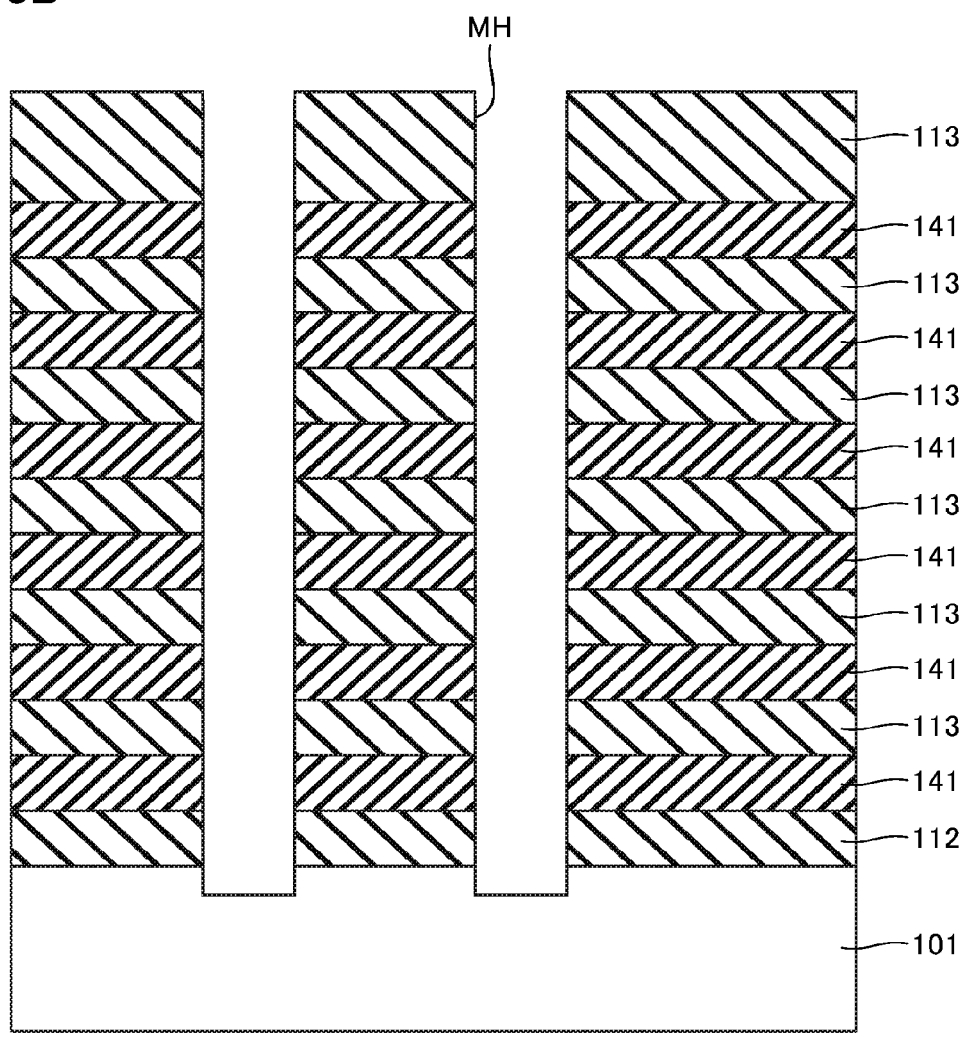
Figure 8C:
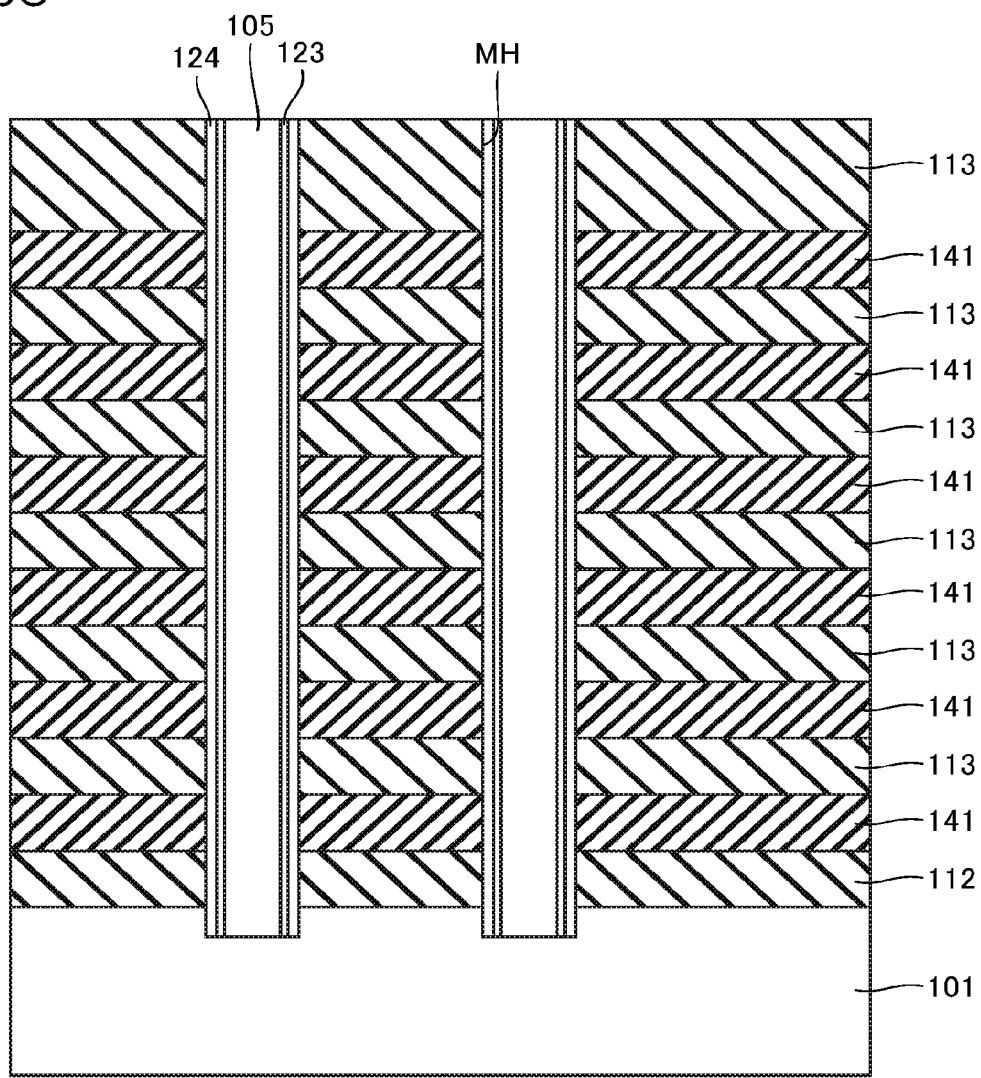

Then, as shown in FIG. 8B, the memory hole MH that penetrates the inter-layer insulating films 112 and 113 and the sacrifice layers 141, is formed. Next, as shown in FIG. 8C, a CVD method is executed to sequentially form the charge accumulation layer 124, the tunnel insulating layer 123, and the memory columnar body 105 inside this memory hole MH, and form the memory unit MU.

Figure 8D:
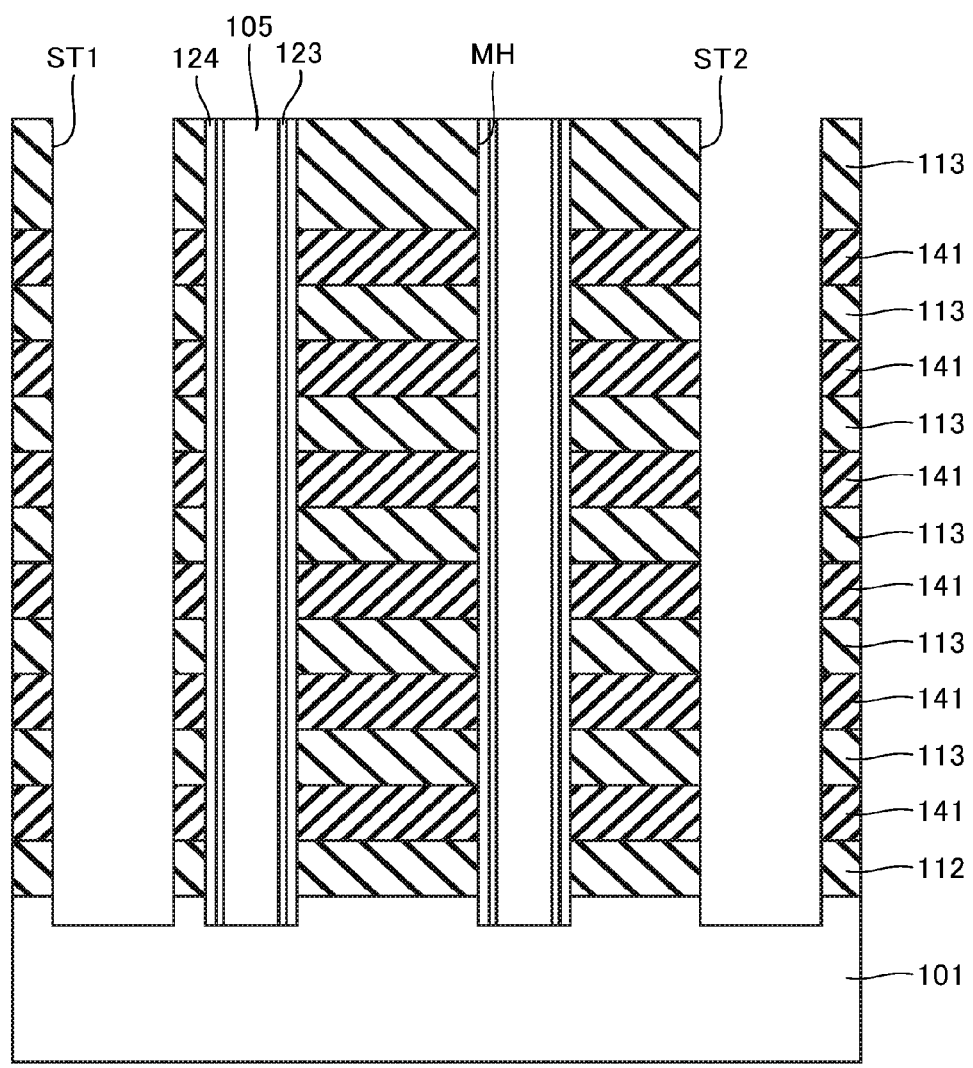

As shown in FIG. 8D, after the memory columnar body 105, and so on, have been formed, RIE is executed to form the slits ST1 and ST2 that penetrate the inter-layer insulating films 112 and 113 and the sacrifice layers 141.

Figure 8E:
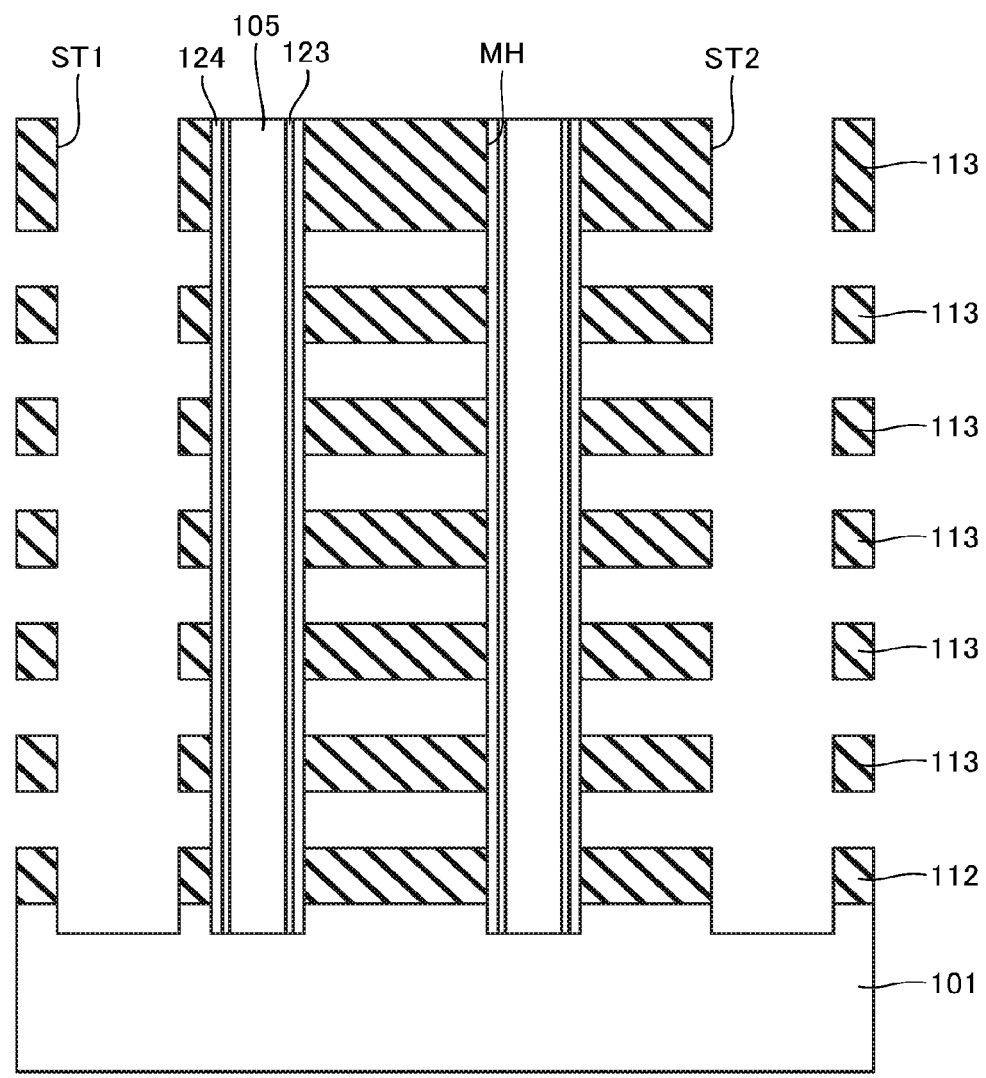
Figure 8F:
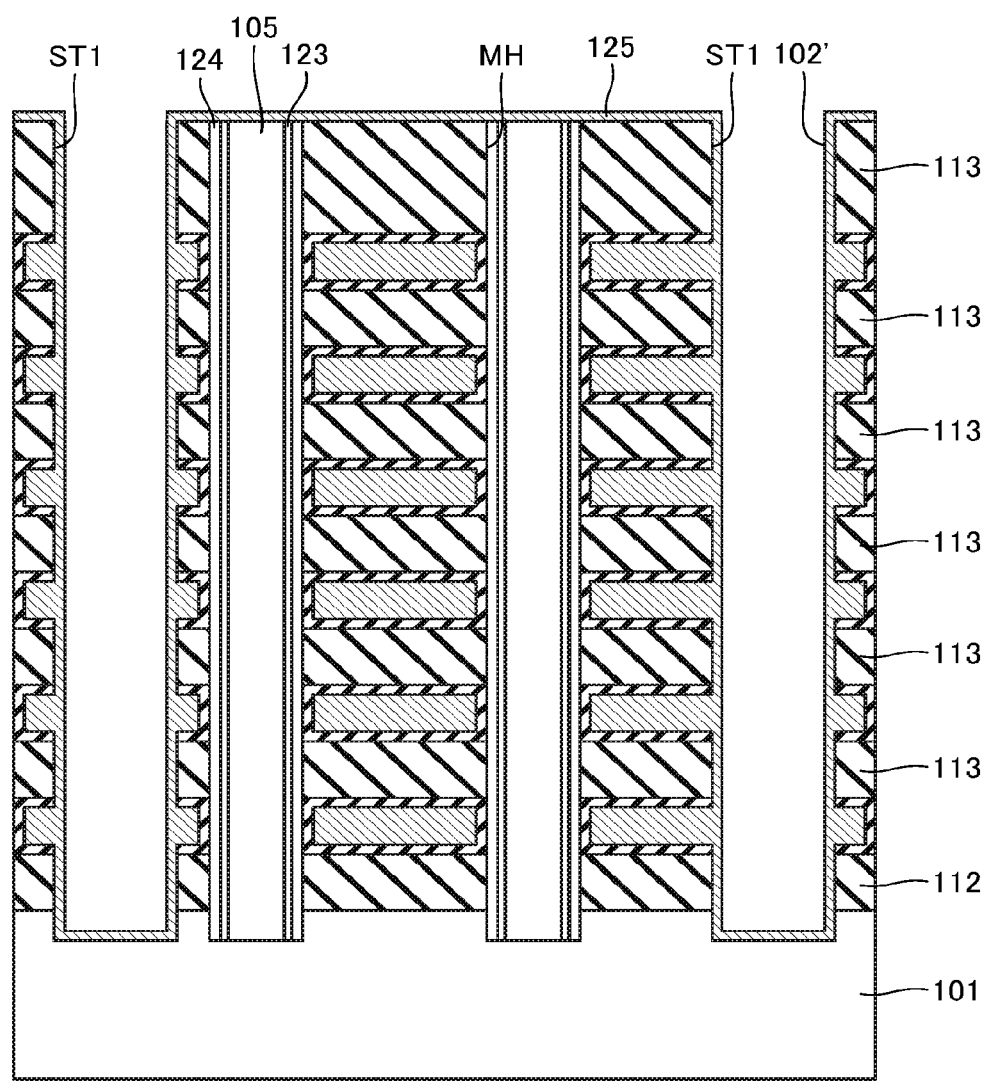
Figure 8G:
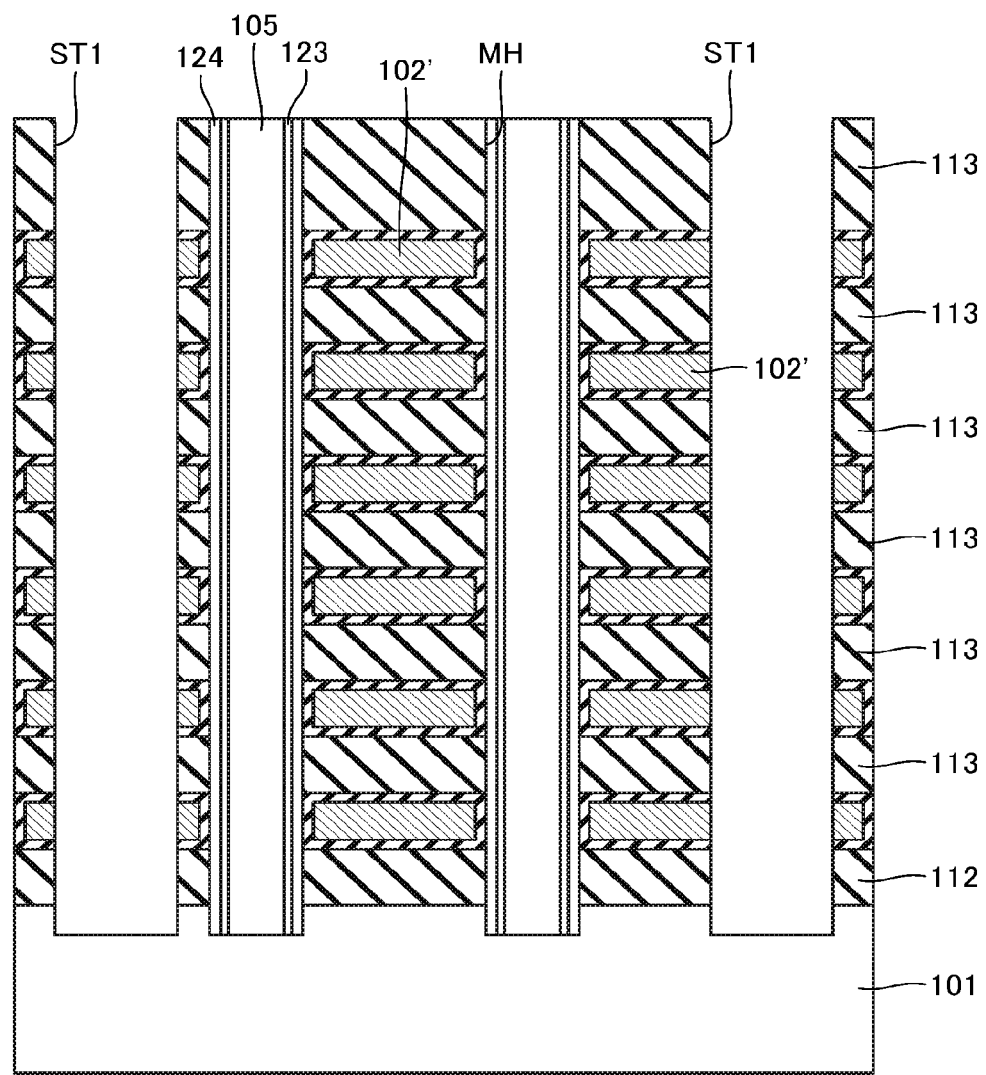

Next, as shown in FIG. 8E, the sacrifice layer 141 is removed, via the slits ST1 and ST2, by wet etching employing a hot phosphoric acid solution. Then, as shown in FIG. 8F, a conductive film 102' configured from tungsten is deposited by a CVD method in a cavity portion left after the sacrifice film 141 was removed. The deposited metal film 102' is deposited in a form protruding more to a central side of the slit than an inner wall of the slits ST1 and ST2. If such a conductive film 102' protruding more to the central side than the inner wall of the slits ST1 and ST2 is left, the conductive films 102 facing each other sandwiching the inter-layer insulating film in the stacking direction attain a short-circuited state, and a desired operation cannot be obtained. Therefore, as shown in FIG. 8G, wet etching is further executed to etch back the conductive film 102', whereby the conductive films 102 adjacent in the stacking direction are prevented from attaining a short-circuited state.

However, since the slit ST2 includes the terminal portion STe, there is a risk that even if an etching back step like that of FIG. 8 is executed, the conductive film 102' is left unetched at this terminal portion STe. In the first embodiment, in order to prevent such an etching residue from occurring, the width D of the terminal portion STe is set larger compared to the width W of the base portion STr as mentioned above.

Figure 9:
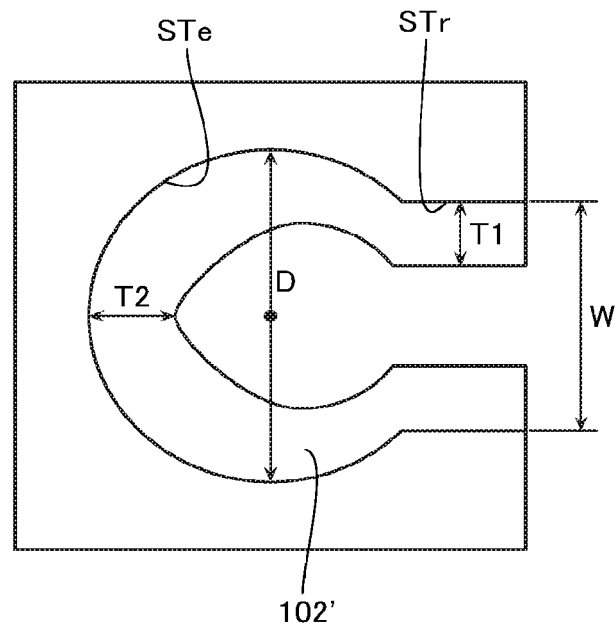
FIG. 9 explains dimensions of each part of the slit ST2 of the semiconductor memory device according to the first embodiment.

FIG. 9 explains a relationship between the width D of the terminal portion STe and the width W of the base portion STr. FIG. 9 shows a state of the conductive film 102' in portions of the terminal portion STe and the base portion STr at a time point when the step of FIG. 8F has finished.

Regarding a protrusion amount of the conductive film 102' from the inner wall of the slit ST2 in the case where the sacrifice film 141 is removed via the slit ST2 and then the conductive layer 102' is deposited, there is a tendency for a protrusion amount T2 of the conductive film 102' in the terminal portion STe to be larger than a protrusion amount T1 of the conductive film 102' in the base portion STr. This is because it is easier for tungsten to accumulate by CVD, and so on, in the case of the terminal portion STe.

Moreover, there is a tendency that the smaller is the width D of the terminal portion STe, the larger becomes a ratio T2/T1. When the ratio T2/T1 is large, there is a risk that in order to prevent short-circuiting of fellow conductive layers facing each other in an up-and-down direction, the conductive layer 102' must be etched back unnecessarily and a resistance value of the conductive layer 102 increases. That is, if etching rates in the terminal portion STe and the base portion STr are identical, then unnecessary etching is inevitable in the base portion STr and the resistance value of the conductive layer 102 ends up rising, since T2 is larger than T1.

Figure 10:
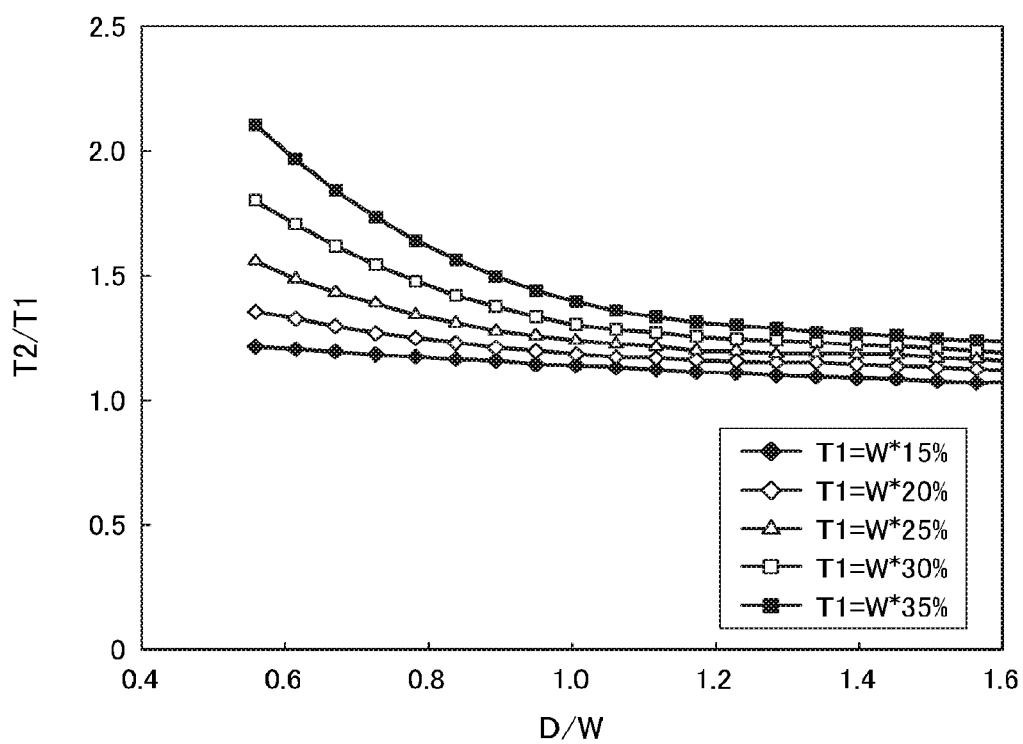
FIG. 10 is a graph explaining the dimensions of the slit ST2.

FIG. 10 shows a relationship of a ratio D/W of D to W and the ratio T2/T1. The larger the ratio D/W becomes, the smaller the ratio T2/T1 becomes, although it differs according to the protrusion amount T1 in the base portion STr (T1=W×15%, 20%, . . . , 35%). That is, an etching back amount of the conductive layer 102' can be reduced. Increase in the resistance value of the conductive layer 102 can be suppressed proportionally to that reduction. As is clear from the graph of FIG. 10, when the ratio D/W is 1.2 or more, the value of T2/T1 is at most about 1.3, regardless of magnitude of the protrusion amount T1, hence D/W is preferably set to 1.2 or more.

Note that the above-mentioned kind of slit ST2 including the broad-width terminal portion STe can be formed by one mask pattern using OPC (Optical Proximity Correction) technology. It is also possible to instead, independently prepare each of a first mask pattern for exposing the base portion STr and a second mask pattern for exposing the terminal portion STe, thereby exposing a pattern of the slit ST2 of the kind shown in FIG. 7.

Figure 11:
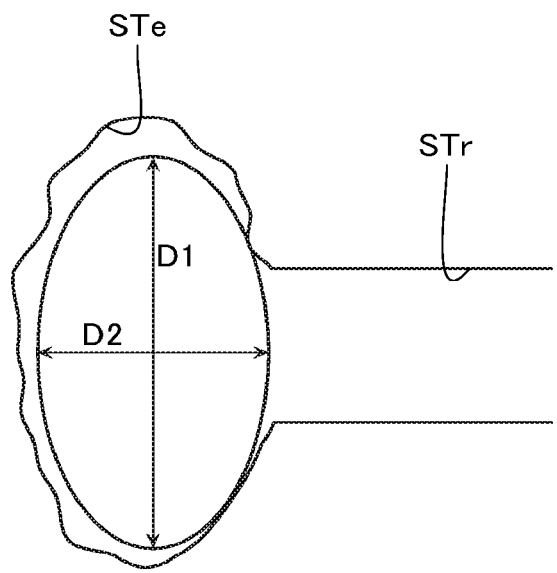
FIG. 11 is a conceptual diagram explaining the shape of the slit ST2 in the first embodiment.

Note that as previously mentioned, the shape of the terminal portion STe, although not actually a strict circular shape, may be approximated to a circular shape or an elliptical shape or oblong shape. As shown in FIG. 11, when the shape of the terminal portion STe has a shape approximated to an ellipse, an ellipse inscribed in the shape of that terminal portion STe may be assumed, and the value of D may be determined assuming a short diameter D2 of that ellipse to be D. FIG. 11 shows an example where the Y direction is a long diameter of the ellipse, but a similar calculation is possible also in the case where conversely a diameter in the Y direction is the short diameter.

As described above, the first embodiment results in a width in the Y direction of the terminal portion STe at the tip of the slit ST2 being set larger compared to that of the base portion STr. Therefore, occurrence of the etching residue of the conductive layer 102' can be effectively suppressed, and a conductive layer 102 of low resistance can be formed with a high yield.

Second Embodiment

Figure 12:
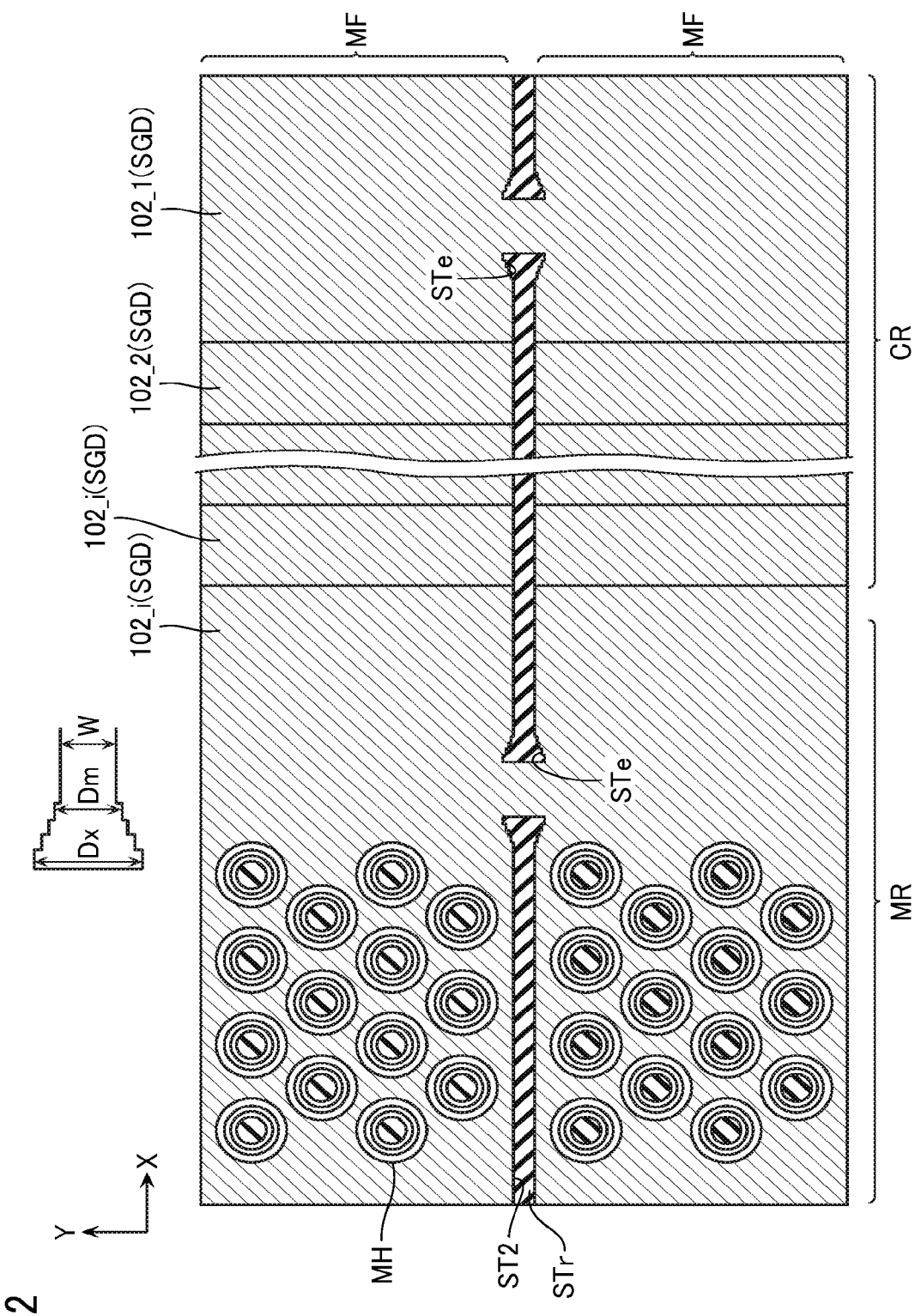
FIG. 12 is a plan view explaining a semiconductor memory device according to a second embodiment.

Next, a semiconductor memory device according to a second embodiment will be described with reference to FIG. 12. As shown in FIG. 12, the semiconductor memory device of this second embodiment has a shape of the terminal portion STe of the slit ST2 that differs from that of the first embodiment. Other basic configuration is similar to that of the first embodiment, hence a duplicated description thereof will be omitted below.

As shown in FIG. 12, the terminal portion STe of the slit ST2 of this embodiment has a shape where its width D in the Y direction increases with increasing distance from a base portion STr side. For example, as shown in FIG. 12, a width Dm of the terminal portion STe close to a boundary between the terminal portion STe and the base portion STr is substantially identical to the width W (Dm≈W). However, the width of the terminal portion STe gradually increases with increasing distance from the base portion STr, and at a position close to its tip furthest from the base portion STr, the terminal portion STe has a maximum width Dx. In the example of FIG. 12, the width of the terminal portion STe is set so as to increase substantially in direct proportion to a distance from the base portion STr, but the present embodiment is not limited to this configuration. Provided that the width D has a gradually increasing shape, it is included in the concept of the second embodiment. Moreover, the example illustrated in FIG. 12 shows an example where the width D of the terminal portion STe changes in steps. However, the present embodiment is not intended to be limited to this configuration, and it is also possible to adopt a shape where the width D changes continuously.

Identical advantages to those of the first embodiment can be displayed also by this second embodiment.

Others

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate;
   a stacked body, the stacked body including a plurality of conductive layers disposed on the semiconductor substrate and an inter-layer insulating film disposed between the plurality of conductive layers;
   a columnar semiconductor layer surrounded by the stacked body, the columnar semiconductor layer extending in a first direction as a stacking direction of the stacked body;

a memory gate insulating film disposed between the columnar semiconductor layer and the stacked body, the memory gate insulating film including a charge accumulation film; and an isolation film which extends from a surface of the stacked body to a bottom of the stacked body and has a longitudinal direction in a second direction parallel to the semiconductor substrate, at least some of the isolation films including a base portion extending in the second direction and a terminal portion positioned at an end of the base portion, and a width in a third direction intersecting the second direction of the terminal portion being larger than a width of the base portion.

2. The semiconductor memory device according to claim 1, wherein an isolation film including the terminal portion is disposed continuously in the second direction and is disposed such that the terminal portions face each other in the second direction.

3. The semiconductor memory device according to claim 2, wherein the conductive layer positioned on a first side in the third direction as viewed from the isolation film and the conductive layer positioned on a second side on an opposite side to the first side as viewed from the isolation film are electrically connected at a position between two of the terminal portions disposed aligned in the second direction.

4. The semiconductor memory device according to claim 1, wherein a width D in the third direction of the terminal portion is 1.2 or more times a width W in the third direction of the base portion.

5. The semiconductor memory device according to claim 4, wherein the terminal portion has a shape which may be approximated to a circle, an ellipse, or an oblong.

6. The semiconductor memory device according to claim 1, wherein the isolation film includes: a first isolation film having a first length in the second direction; and a second isolation film having a second length shorter than the first length in the second direction, and the second isolation film includes the terminal portion in a stepped wiring line portion where the stacked body is formed in steps.

7. The semiconductor memory device according to claim 6, wherein the isolation film including the terminal portion is disposed continuously in the second direction and is disposed such that the terminal portions face each other in the second direction.

8. The semiconductor memory device according to claim 7, wherein the conductive layer positioned on a first side in the third direction as viewed from the second isolation film and the conductive layer positioned on a second side on an opposite side to the first side as viewed from the second isolation film are electrically connected at a position between two of the terminal portions disposed aligned in the second direction.

9. The semiconductor memory device according to claim 6, wherein a width D in the third direction of the terminal portion is 1.2 or more times a width W in the third direction of the base portion.

10. The semiconductor memory device according to claim 9, wherein the terminal portion has a shape which may be approximated to a circle, an ellipse, or an oblong.

11. The semiconductor memory device according to claim 1, wherein the terminal portion has a shape where a width in the third direction increases with increasing distance from a side of the base portion.

12. The semiconductor memory device according to claim 11, wherein the isolation film includes: a first isolation film having a first length in the second direction; and a second isolation film having a second length shorter than the first length in the second direction, and the second isolation film includes the terminal portion in a stepped wiring line portion where the stacked body is formed in steps.

13. The semiconductor memory device according to claim 11, wherein the second isolation film includes the terminal portions in an uppermost layer of the stepped wiring line portion and in a lowermost layer of the stepper wiring line portion.

\* \* \* \* \*